United States Patent
Kung et al.

(10) Patent No.: US 6,716,037 B2
(45) Date of Patent: Apr. 6, 2004

(54) FLEXIBLE ELECTRIC-CONTACT STRUCTURE FOR IC PACKAGE

(75) Inventors: Moriss Kung, Taipei (TW); Kwun-Yao Ho, Taipei (TW)

(73) Assignee: Via Technologies, Inc., Taiwan (CN)

( * ) Notice: Subject to any disclaimer, the term of this patent is extended or adjusted under 35 U.S.C. 154(b) by 0 days.

(21) Appl. No.: 10/256,424

(22) Filed: Sep. 27, 2002

(65) Prior Publication Data

US 2004/0018753 A1 Jan. 29, 2004

(30) Foreign Application Priority Data

Jul. 23, 2002 (TW) .................................. 91211189 U

(51) Int. Cl.[7] .............................................. H01R 12/00
(52) U.S. Cl. ....................................................... 439/66
(58) Field of Search ..................................... 439/66, 91

(56) References Cited

U.S. PATENT DOCUMENTS

| | | | | |
|---|---|---|---|---|
| 6,270,363 B1 | * | 8/2001 | Brofman et al. | 439/91 |
| 6,280,207 B1 | * | 8/2001 | Sakata et al. | 439/91 |
| 6,312,266 B1 | * | 11/2001 | Fan et al. | 439/91 |
| 6,338,629 B1 | * | 1/2002 | Fisher et al. | 439/91 |
| 6,354,844 B1 | * | 3/2002 | Coico et al. | 439/66 |
| 6,386,890 B1 | * | 5/2002 | Bhatt et al. | 439/66 |
| 6,425,772 B1 | * | 7/2002 | Bernier et al. | 439/91 |
| 6,439,894 B1 | * | 8/2002 | Li | 439/66 |
| 6,447,308 B1 | * | 9/2002 | McCarthy et al. | 439/91 |
| 6,490,161 B1 | * | 12/2002 | Johnson | 439/66 |
| 6,491,527 B1 | * | 12/2002 | Smith | 439/66 |
| 6,527,563 | * | 3/2003 | Clayton | 439/66 |
| 6,535,395 | * | 3/2003 | Harrison et al. | 439/91 |
| 6,540,525 | * | 4/2003 | Li et al. | 439/66 |

* cited by examiner

Primary Examiner—Gary F. Paumen

(57) ABSTRACT

A flexible electric-contact structure for an IC package connecting with a circuit board. The structure provides an electric connection between a circuit board having a plurality of connection pads arranged appropriately and an IC package, which includes an IC substrate and a plurality of elastic conductors. The IC substrate has a top plane and a bottom plane, two of which are corresponded to each other. On the bottom plane, there is a plurality of soldering pads arranged in corresponding to the connection pads respectively. On the top plane, at least one chip is attached. The elastic conductor is configured as an arm having a first end plane and a second end plane. After the first end plane is connected to the soldering pad or the connection pad, the second end plane is formed as a free end. Through a force applied to the second end plane to press the elastic conductor to proceed an appropriate displacement, an electric contact with good co-planarity is resulted between the IC substrate and the circuit board.

10 Claims, 6 Drawing Sheets

FIG. 5A

FLEXIBLE ELECTRIC-CONTACT STRUCTURE FOR IC PACKAGE

FIELD OF THE INVENTION

The invention relates to an electric-contact structure for an IC package, especially to a flexible electric-contact structure including a plurality of elastic conductors arranged on an IC package substrate or a circuit board to proceed an electric connection with good co-planarity between the IC package and the circuit board.

BACKGROUND OF THE INVENTION

Since long time ago, there are two ways to dispose an integrated circuit package (abbreviated as "IC package") in a circuit board (or a main board).

One way is to directly solder the IC package firmly on the circuit board, while the other way is replaceable and capable of plugging-in and pulling-out. This kind of electric-contact IC package is usually appropriate for an IC device needed to be upgraded or renewed, or it is applied for the IC device with higher single price. When one of the circuit board or the IC device is malfunctioned or needed to be renewed, then the other element may still be kept for usage; for example, a central processing unit (abbreviated as "CPU") of computer is a typical example.

Please refer to FIG. 1 and FIG. 2, which is a replaceable socket typically seen in current market. Traditionally, in order to have the objectives of both the replaceable manner and the excellent electric connection, the traditional way is to dispose a plurality of pins 111 on the IC package 11, and a socket 13 having a plurality of pin holes 131 is also disposed on the circuit board 12 for providing the IC package 11 to be inserted in. The package way of the prior IC package II has two ways, that is, the lead frame and the ball grid array (abbreviated as "BGA"). Recently, in order to pursue the IC device with high efficiency (i.e., high heat dissipation) and high pin count, a flip chip BGA package is usually applied. Its basically constituting elements are shown as FIG. 1. An IC chip 112 is disposed on one side surface of a substrate 113 by flip chip manner, and several solders 114 are arranged on another side surface and electrically coupled to the chip 112 through the circuit design of the substrate 113, while the non-active surface of the other side of the chip 112 is then adhered with a heat sink 115. Since pin 111 is not an extremely rigid object and easily distorted and damaged during the procedure of plugging-in and pulling-out, so it is uneasy to be connected firmly to the solders 114. Therefore, in current technique, after being molded and fixed on an interposer 116, the plural pins 111 are then welded to the solders 114.

To provide the pin 111 of the IC package 11 according to the prior arts with a capability to be inserted in and also be pulled out, all the socket 13 according to the prior arts used today includes following elements: an inserting seat 132 bonded on the circuit board and having a plurality of inserting holes 131, a gliding board 133 capable of being arranged and covered on the top plane of the inserting seat 132 with a linearly gliding manner, and a pulling long rod 134 arranged at the side surface of the inserting seat 132 for driving the gliding board 133 to proceed slightly gliding movement. Inside each of the pinholes 131 of the inserting seat 132, there is a conducting metallic piece (not shown in the figure) arranged and there are solders 135 in the bottom of the pinholes 131 for being bonded and further making an electric connection to the circuit board 12. Slightly larger openings (not shown in the figure) are arranged on the gliding board 133 in positions corresponding to the pinholes 131. By pressing down the pulling long rod 134 that is rotated to a horizontal direction to the inserting seat 132 by taking the rod axis 136 as a rotation axis, the gliding board 133 is proceeded a slightly gliding motion to tightly insert the pins 111 of the IC package 11 into the pinholes 131. When the IC package 11 is going to be pulled out, the pulling long rod 134 is rotated to a vertical position formed as ninety degrees to the inserting seat 132, such that the inserting pins 111 are loosened to take out the IC package 11.

Since the pulling long rod 134 of above socket 13 occupies too large area, so an additional space is needed for accommodating the pulling long rod 134 and the rod axis 136 thereof; such that its occupying area in the circuit board is relatively larger. Therefore, the pulling long rod 134 needs a larger range for proceeding the pivoting action, and no any other element can be arranged within the pivoting and rotating space of the pulling long rod 134. So a limitation of space application is caused and, since the arranging position of the pulling long rod 134 is different, so the biasing gravity position causes the weight of the socket 13 unable to be distributed uniformly, such that the socket 13 will be damaged during connection because of the biasing position; invisibly. Furthermore, the cost will be increased for the relative industry, and this is an urgent problem needed to be solved immediately. And, in order to promote the industrial competition ability, this problem has to be broken-through as soon as possible.

SUMMARY OF THE INVENTION

The main objective of the invention is to provide a flexible electric-contact structure for an IC package, which applies a plurality of elastic conductors for proceeding a stable electric connection through physical contact, such that the shortcoming of the prior arts, it is easy for the applied metallic pins to damage the circuit board and increase the production cost, is overcome.

The secondary objective of the invention is to provide a flexible electric-contact structure for an IC package, which applies a plurality of elastic conductors to replace the pulling long rod and pins used in the traditional socket, such that the shortcomings of the prior arts, as complicated structure, larger occupied area, biased gravity center, and large operation space, etc., are overcome.

The further objective of the invention is to provide a flexible electric-contact structure for an IC package, which applies a positioning fastener to position and secure the IC substrate and the circuit board for reaching the functions of easy operation, position, and connection.

To achieve above objectives, the flexible electric-contact structure for an IC package according to the invention may provide an electric connection between the IC package and a circuit board disposed with at least one placing-and-fixing hole, wherein the circuit board has a plurality of connection pads arranged appropriately, and flexible electric-contact structure is comprised of an IC substrate, a plurality of elastic conductors, and at least one positioning fastener.

The IC substrate has a top plane and a bottom plane, both which are corresponding to each other, and the IC substrate may electrically connect to the circuit board. On the bottom plane, there is a plurality of soldering pads arranged in corresponding to the connection pads of the circuit board respectively and, on the top plane, at least one chip is supported.

The elastic conductor is configured as an arm having a first end plane and a second end plane, wherein the first end plane is connected to one of the soldering pads of the IC substrate, and the second end plane is formed as a free end. In another preferable embodiment of the invention, the first end plane may also be connected to one of the connection pads of the circuit board, and the second end plane is formed as a free end.

Wherein, by electrically connecting the IC substrate to the circuit board, a force is applied to press the elastic conductor for proceeding an appropriate displacement motion. And the positioning fastener physically connects both the IC substrate and the placing-and-fixing hole to each other for fixing the electric-contact positions between the IC substrate and the circuit board.

In a further preferable embodiment of the flexible electric-contact structure for an IC package according to the invention, flexible electric-contact structure is comprised of a circuit board, at least one IC substrate, an interposer, and at least one positioning fastener.

The circuit board has at least one connecting pad zone, which has a plurality of connection pads aligned appropriately and, at an appropriate position outside the connecting pad zone, the circuit board is further arranged with at least one placing-and-fixing hole.

The IC substrate may electrically connect to the connecting pad zone, and the IC substrate has a top plane and a bottom plane, both which are corresponding to each other. On the bottom plane, a plurality of soldering pads are arranged in corresponding to the connection pads of the circuit board respectively and, on the top plane, at least one chip may be supported.

The interposer has a plurality of through holes corresponding to the connection pads respectively and a positioning hole corresponding to the placing-and-fixing hole, wherein inside the through hole, an elastic conductor is arranged and, by applying a force on it, the elastic conductor may proceed an appropriate displacement motion.

Wherein, by arranging the interposer between the IC substrate and the circuit board, it may provide an electric connection and apply a force pressed on the elastic conductor to proceed an appropriate displacement motion. And, a positioning fastener is passed through a positioning hole at the interposer to physically connect the IC substrate and the placing-and-fixing hole for fixing the electric connection positions between the IC substrate and the connecting pad zone.

For your esteemed members of reviewing committee to further understand the functions and the characteristics of the invention, a detailed description together with corresponding drawings are presented as the following.

BRIEF DESCRIPTION OF THE DRAWINGS

FIG. 5A is a cross-sectional view for illustrating the structure of the first preferable embodiment of the elastic conductor according to the invention.

DETAILED DESCRIPTION OF THE INVENTION

Figure 1:
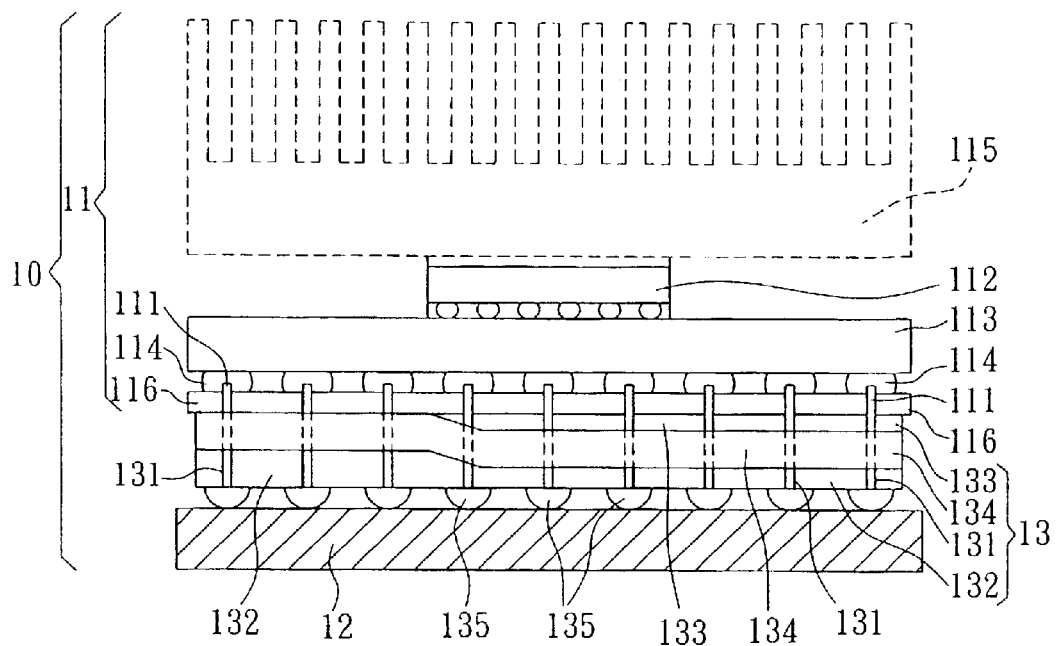
FIG. 1 is a transparent side view for illustrating the socket according to the prior arts.

The main technical spirit of the invention is to apply a plurality of elastic conductors for elastic physical contact to keep a good and stable electric connection between an IC package and a circuit board, such that the shortcomings, that an application of a socket of a pulling long rod causes a bias of gravity center, and the occupying area g area large, of the prior arts are overcome.

The detailed means, action manners, achievable functions, and other technical characteristics of the flexible electric-contact structure for an IC package according to the invention are presented in several preferable embodiments as the following.

Please refer to FIG. 3A through FIG. 3D, which are the cross-sectional explosive views for illustrating the preferable embodiments of the flexible electric-contact structure for an IC package according to the invention. The invention is mainly to apply a plurality of elastic conductors 5 to provide an electric connection between an IC package 3 and a circuit (main) board 2, both of which may be separated from each other.

The circuit board 2 has at least one connecting pad zone 21, and a plurality of connection pads aligned appropriately and made of conducting materials are formed on the upper surface of the connecting pad zone 21. Preferably, the materials of the connection pad 22 may be nickel, gold, chromium, copper, iron, aluminum, titanium, lead, tin, or other alloy, etc. The plurality of connection pads 22 aligned appropriately is exposed to the outside to proceed a electric connection with the IC package 3 of the invention. Of course, on the circuit board 2, other known electronic elements, such as capacitor and resistor, etc. or other IC elements (not shown in the figure) may be arranged. Since such kind of electronic elements arranged on the circuit board 2 is belonged to the prior arts and is not the technical characteristic of the invention, so a detailed description is skipped herein.

The IC package 3 is combined and constituted by an IC chip and a chip substrate 30 having circuit layout. The chip substrate 30 may provide an electric connection with the circuit board and, preferably, the chip substrate 30 has a lop plane 31 and a bottom plane 32, both of which are corresponded to each other and, on the bottom plane 32, a plurality of soldering pads 33 are arranged in corresponding to each connection pad 22 and, on the top plane 31, an IC chip 40 is attached.

Figure 3A:
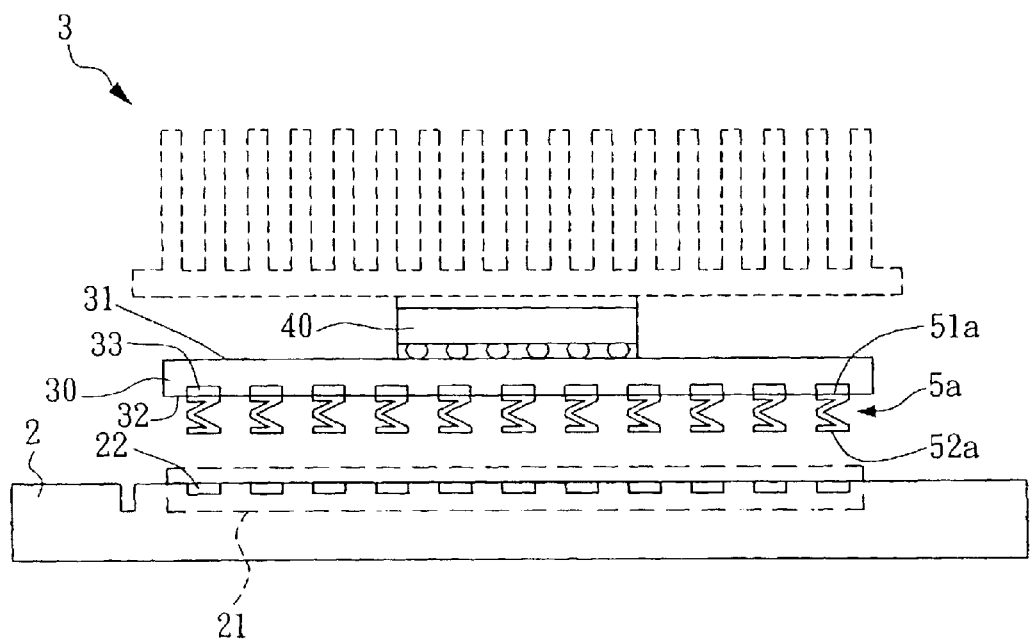
FIG. 3A is a cross-sectional explosive view for illustrating the structure of the first preferable embodiment of the flexible electric-contact structure for an IC package according to the present invention.

Please refer to FIG. 3A, which is the first preferable embodiment according to the invention, wherein the elastic conductor 5a is configured as an arm having a first end plane 51a and a second end plane 52a. The first end plane 51a is connected with the soldering pad 33, and the second end plane 52a is a free end. When the chip substrate 30 is electrically connected to the circuit board 2, the circuit board 2 will provide a force applied to the second end plane 52a to press the elastic conductor 5a to proceed an appropriate displacement motion. Since the distance between each soldering pad 33 and the connection pad could be different when the chip substrate 30 is electrically connected to the circuit board 2 so, by forcing each elastic conductor 5a to proceed different and appropriate displacement motion, the distance between each soldering pad 33 and the connection pad 22 will be shortened and formed into the same to result a good co-planarity.

Figure 3B:
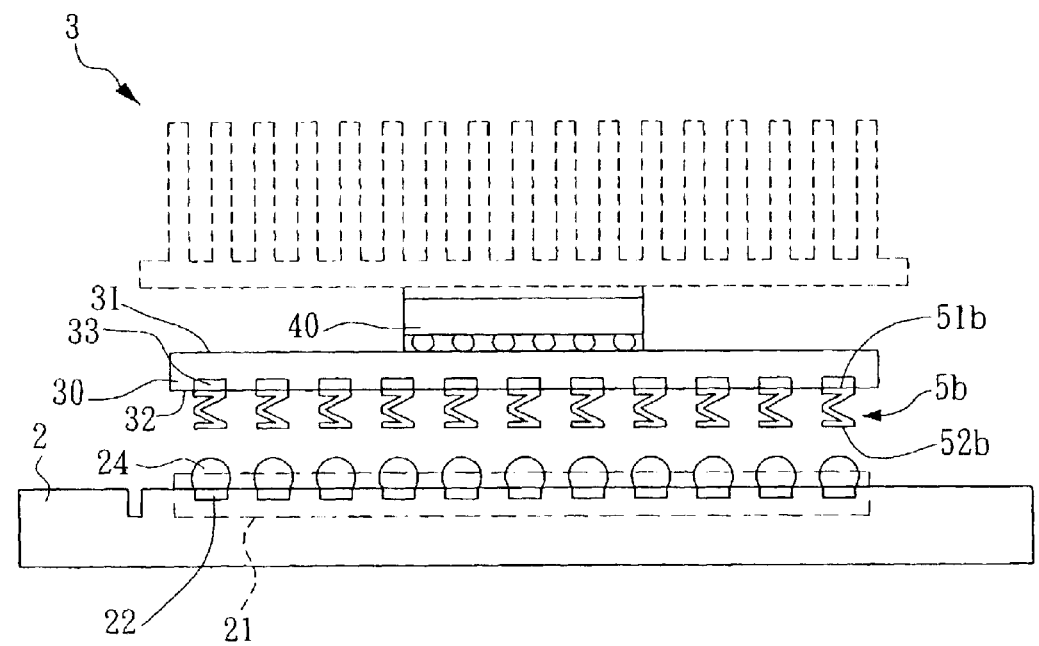
FIG. 3B is a cross-sectional explosive view for illustrating the structure of the second preferable embodiment of the flexible electric-contact structure for an IC package according to the present invention.

Please refer to FIG. 3B, which is the second preferable embodiment according to the invention, wherein the first end plane 51b of the elastic conductor 5b is connected to the soldering pad 33, and the second end plane 52b is formed as a free end. On the connection pad 22, a solder ball 24 is further arranged. The solder ball 24 is correspondingly in contact with the elastic conductor 5b for providing an electric connection between the chip substrate 30 and the circuit board 2. Since the size of the solder ball 24 could be not uniform and, when the chip substrate 30 makes an electric connection to the circuit board 2, the planarity of each solder ball 24 could be different, each elastic conductor 5b will be forced to proceed different and appropriate displacement motion to result an excellent and consistent electric connection with a good co-planarity.

Figure 3C:
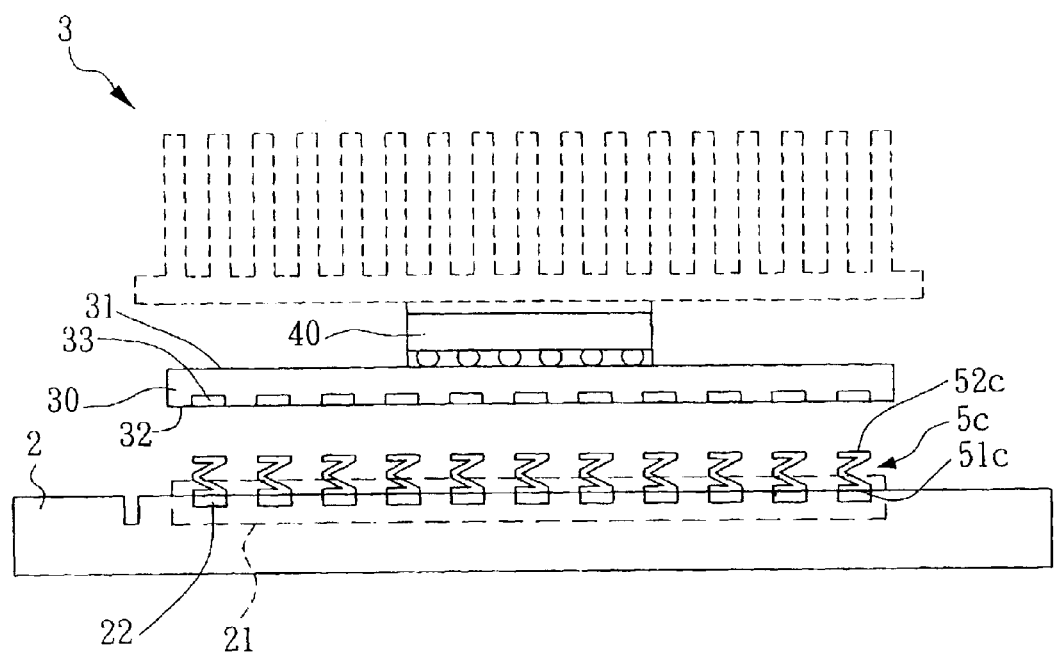
FIG. 3C is a cross-sectional explosive view for illustrating the structure of the third preferable embodiment of the flexible electric-contact structure for an IC package according to the present invention.

Please refer to FIG. 3C, which is the third preferable embodiment according to the invention, wherein the first end plane 51c of the elastic conductor 5c is connected to the connection pad 22, and the second end plane 52c is a free end. By making the chip substrate 30 electrically connected to the circuit board 2, the chip substrate 30 will provide a force applied to the second end plane 52c to press the elastic conductor 5c to proceed an appropriate displacement motion. When the chip substrate 30 is electrically connected to the circuit board 2, the distance between each soldering pad 33 and the connection pad 22 could be different, so each elastic conductor 5c is pressed to proceed different appropriate displacement motion, such that the distance between each soldering pad 33 and the connection pad 22 is shortened and formed into the same to result a good co-planarity. Of course, a plurality of solder balls (not shown in the figure) can be further arranged on the soldering pads 33 of the chip substrate 30 respectively and correspondingly in contact with the elastic conductors 5c respectively to provide electric conduction between the chip substrate 30 and the circuit board 2.

Figure 3D:
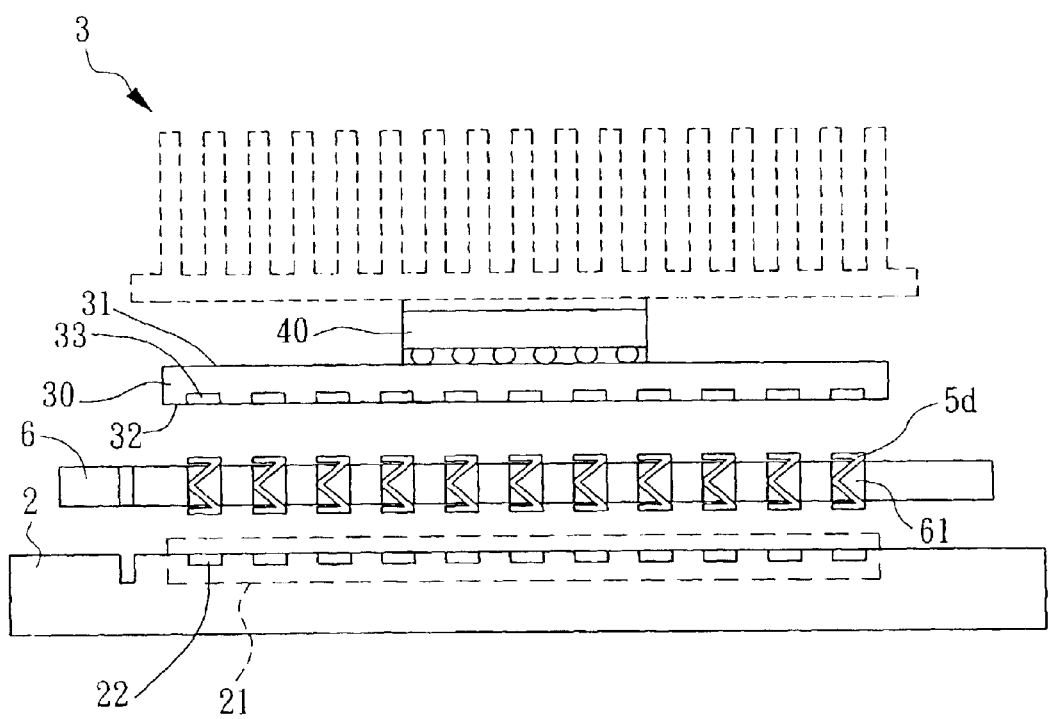
FIG. 3D is a cross-sectional explosive view for illustrating the structure of the fourth preferable embodiment of the flexible electric-contact structure for an IC package according to the present invention.

Please refer to FIG. 3D, which is the fourth preferable embodiment according to the invention, wherein an interposer 6 is further arranged between the chip substrate 30 and the circuit board 2. The interposer 6 has a plurality of through holes 61 that are respectively corresponded to the connection pad 22. Inside the through hole 61, the elastic conductor 5d is arranged. By applying a force, the elastic conductor 5d may proceed an appropriate displacement motion. When the chip substrate 30, through the interposer 6, makes a corresponding contact with the circuit board 2, an electric connection will be formed between the chip substrate 30 and the circuit board 2. And the elastic conductor 5d will be pressed to proceed an appropriate displacement motion by the force interaction between the chip substrate 30 and the circuit board 2, such that the distances between the soldering pad 33 and the connection pad 22 be shortened and consistent with a good co-planarity.

In above preferable embodiments of the invention, the plurality of elastic conductors 5 are all arranged according to a uniform distribution, such that the gravity position of the chip substrate 30 will not be biased when it makes an electric connection with the circuit board 2, and a preferable co-planarity of the contact for the chip substrate 30 is formed. Furthermore, because of the pressing contact between the elastic conductor 5 and the connection pad 22, the area of the second plane 52 will be increased, and a sufficient and stable physical contacting plane will be further maintained between the elastic conductor 5 and the connection pad 22. Therefore, a function of sufficient and excellent conduction may be maintained between the chip substrate 30 and the circuit board 2.

Figure 4A:
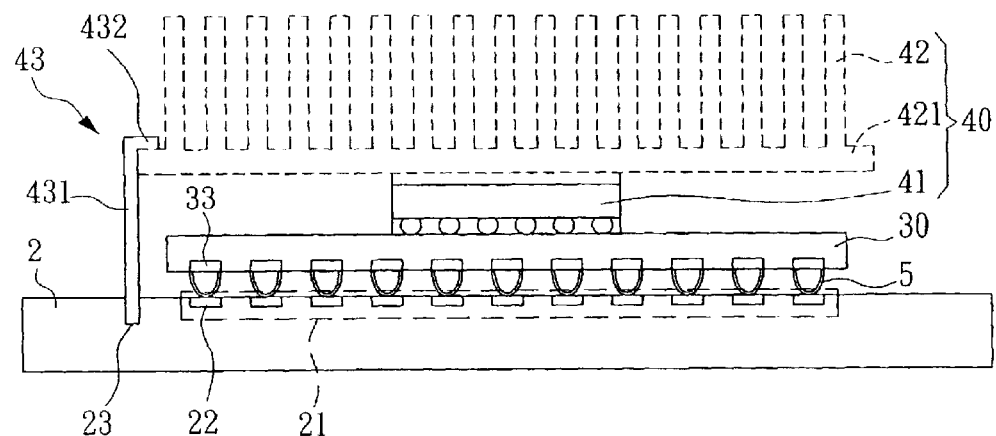
FIG. 4A is a cross-sectional assembly view for illustrating the structure of the first preferable embodiment of the flexible electric-contact structure for an IC package with the single positioning fastener according to the invention.

Detailed means, action manners, and achievable functions of the positioning fastener of the invention, and other technical characteristics of the invention will be described in the following embodiments. Please refer to FIG. 4A, which is a cross-sectional assembly view for illustrating the preferable embodiment of the flexible electric-contact structure for an IC package with a single positioning fastener according to the invention. In the preferable embodiment of the invention, the IC device 40 is further comprised of a main body 41, and a heat sink 42, and at least one positioning fastener 43 is included. The main body 41 is electrically connected to the chip substrate 30. The main body 41 and the chip substrate 30 may be a well-known flip chip BGA element or other kind of BGA element, such as wire bonding or tape automated bonding (abbreviated as "FAB"), which are belonged to the prior arts and are not the technical characteristics of the invention, so a detailed description is not presented herein. The heat sink 42 is attached to the other side of the main body 41 by pasting manner. The heat sink 42 may provide an enhancing function of heat dissipation to the IC chip main body 41, and two sides of the heat sink 42 are respectively arranged with a flange 421. In the present preferable embodiment according to the invention, the circuit board 2 is further arranged with a placing-and-fixing hole 23 at an appropriate position outside the connecting pad zone 21. The positioning fastener 43 has a pillar body 431 and a side hook 432, which is fixed and connected to the flange 421 and is positioned on the placing-and-fixing hole 23 by being inserted and connected with the pillar body 431 for providing an connection, position, and fixation to both the chip substrate 30 and the connecting pad zone 21. Wherein, it may also be designed that the placing-and-fixing hole 23 is penetrated through the circuit board 2, so the circuit board 2 may be designed as a circuit board 2 having a single layer circuit layout or a double layers circuit layout for reducing the manufacture cost.

Figure 4B:
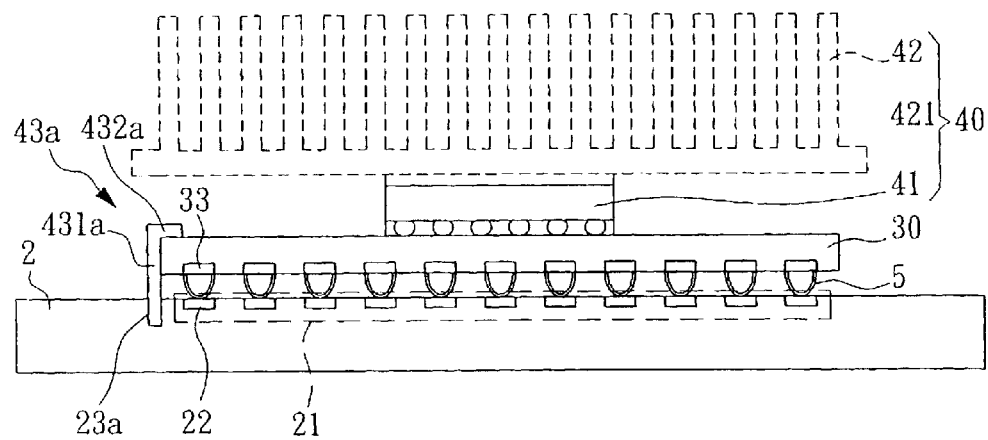
FIG. 4B is a cross-sectional assembly view for illustrating the structure of the second preferable embodiment of the flexible electric-contact structure for an IC package with the single positioning fastener according to the invention.

Please refer to FIG. 4B, which is another preferable embodiment of the positioning fastener 43a according to the invention. The side hook 432a of the positioning fastener 43a is fixed and connected to the side surface of the chip substrate 30 and is positioned on the placing-and-fixing hole 23a by being inserted and connected to the pillar body 431a, so the positioning fastener 43 according to this embodiment is designed to be further shortened and material saving. Since the distance is shortened, so the design and position will be more convenient. Those who are skilled in such arts according to above disclosure may execute such kind of variation, but it still possesses the merits of the invention and is also within the spirit and the range of the invention, so a detailed description is skipped herein.

Figure 4C:
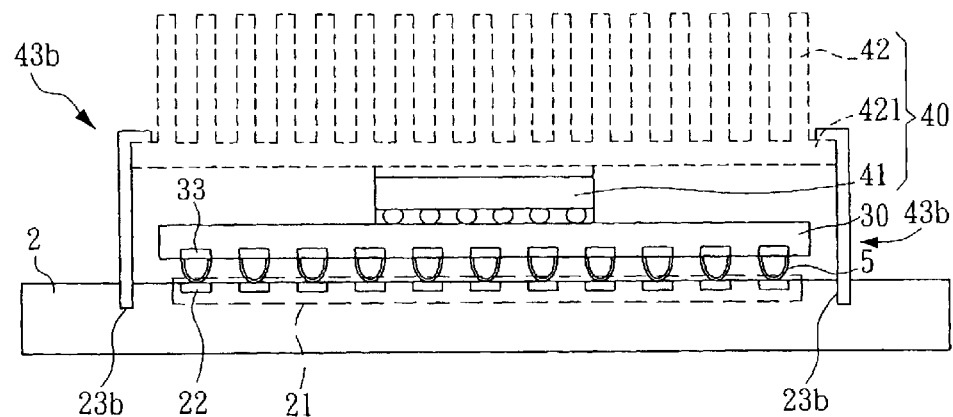
FIG. 4C is a cross-sectional assembly view for illustrating the structure of the preferable embodiment of the flexible electric-contact structure for an IC package according to the invention having a symmetrically positioning fastener.

As shown in FIG. 4C, there are two placing-and-fixing holes 23b designed, and they are arranged respectively at the two sides out of the connecting pad zone 21. At this time, there are two positioning fastener 43b arranged correspondingly for facilitating the IC device 40 in being fixed on a plane of preferable co-planarity. Of course, the number of the placing-and-fixing holes 23b and the positioning fastener 43b may be designed as three or more than three. Those who are skilled in such arts according to above disclosure may execute such kind of number variation, but it still has the merits of the invention and is also within the spirit and the range of the invention, so a detailed description is skipped herein.

Figure 4D:
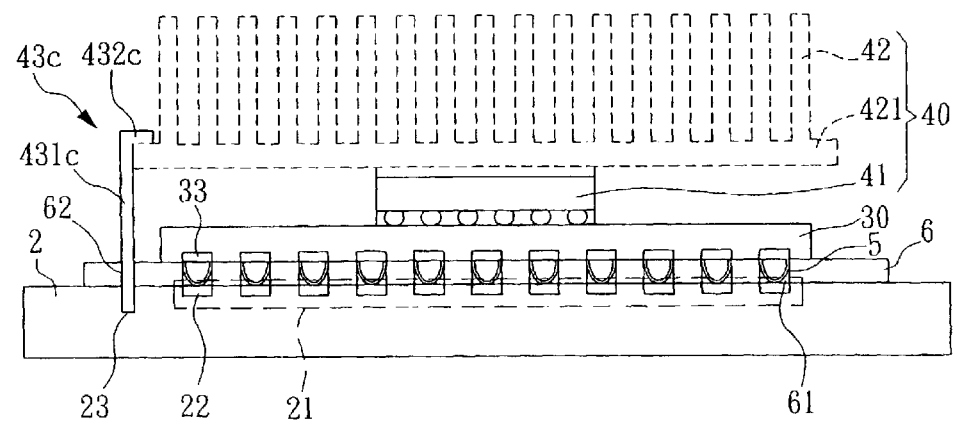
FIG. 4D is a cross-sectional assembly view for illustrating the structure of the preferable embodiment of the flexible electric-contact structure for an IC package according to the invention having a positioning fastener connected with an interposer.

Please refer to FIG. 4D, which is a cross-sectional assembly view for illustrating the structure of the preferable embodiment of the flexible electric-contact structure for an IC package according to the invention having a positioning fastener connected with an interposer. In the present embodiment according to the invention, a positioning hole 62 is further arranged at the interposer 6 at a position corresponding to the placing-and-fixing hole 23 of the circuit board 2. By arranging the interposer 6 between the chip substrate 30 and the circuit board 2, the pillar body 431c of the positioning fastener 43 is passed through the positioning hole 62 and arrived at the placing-and-fixing hole 23c for providing an firm connection and position between the chip substrate 30 and the connecting pad zone 21.

Figure 5E:
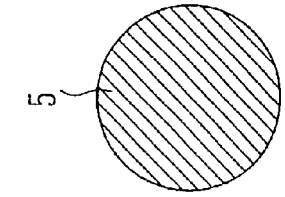
FIG. 5E is a cross-sectional view for illustrating the structure of the fifth preferable embodiment of the elastic conductor according to the invention.
Figure 5D:
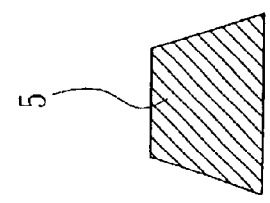
FIG. 5D is a cross-sectional view for illustrating the structure of the fourth preferable embodiment of the elastic conductor according to the invention.
Figure 5C:
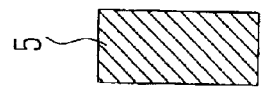
FIG. 5C is a cross-sectional view for illustrating the structure of the third preferable embodiment of the elastic conductor according to the invention.
Figure 5B:
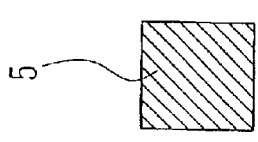
FIG. 5B is a cross-sectional view for illustrating the structure of the second preferable embodiment of the elastic conductor according to the invention.
Figure 5I:
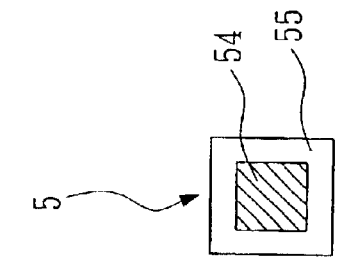
FIG. 5I is a cross-sectional view for illustrating the structure of the ninth preferable embodiment of the elastic conductor according to the invention.
Figure 5H:
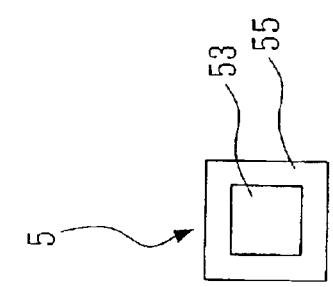
FIG. 5H is a cross-sectional view for illustrating the structure of the eighth preferable embodiment of the elastic conductor according to the invention.
Figure 5G:
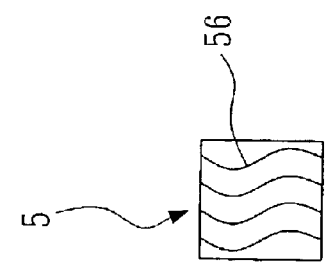
FIG. 5G is a cross-sectional view for illustrating the structure of the seventh preferable embodiment of the elastic conductor according to the invention.
Figure 5F:
FIG. 5F is a cross-sectional view for illustrating the structure of the sixth referable embodiment of the elastic conductor according to the invention.

In order to further understand the preferable execution of the elastic conductor according to the invention, several cross-sectional structures of a plurality of preferable embodiments for the elastic conductors will be presented as the following to describe in detail about the technical characteristics of the invention. In the present embodiment according to the invention, the cross-sectional structure of the elastic conductor 5 may be designed as solid configurations, such as: square form (as shown in FIG. 5A), rectangular form (as shown in FIG. 5B), trapezoid form (as shown in FIG. 5C), semicircular form (as shown in FIG. 5D), circular form (as shown in FIG. 5E) or I-formed beam (as shown in FIG. 5F), etc. In order to make an appropriate displacement motion by pressing above elastic conductor 5 formed as solid configuration, the materials of the elastic conductor 5 are comprised of elastic metal, foaming metal, elastic conducting rubber, conducting polymer, or the constituting materials thereof. For achieving the objective for the elastic conductor 5 to provide an electric connection for both the chip substrate 30 and the circuit board 2, the elastic conductor 5 may also be configured as above forms but be constituted of metal fibers (or including conducting wires) 56 material (as shown in FIG. 5G). Of course, the elastic conductor 5 may also be configured as above forms but with hollow structure, while the outside part of the elastic conductor 5 is made of metal or metal composition 55, which covers a compressed space 53 (as shown in FIG. 5H). In other preferable embodiments, the elastic conductor 5 may also be a device, inside which itself is an elastic stuffing object 54 without electricity conduction, and outside which the surface is coated with metal or metal composition 55 (as shown in FIG. 5I). Those who are skilled in such arts according to above disclosure may execute such kind of variations of materials or cross-sectional structures, but they still possess the merits of the invention and are also within the spirit and the range of the invention, so a detailed description is skipped herein.

Figure 2:
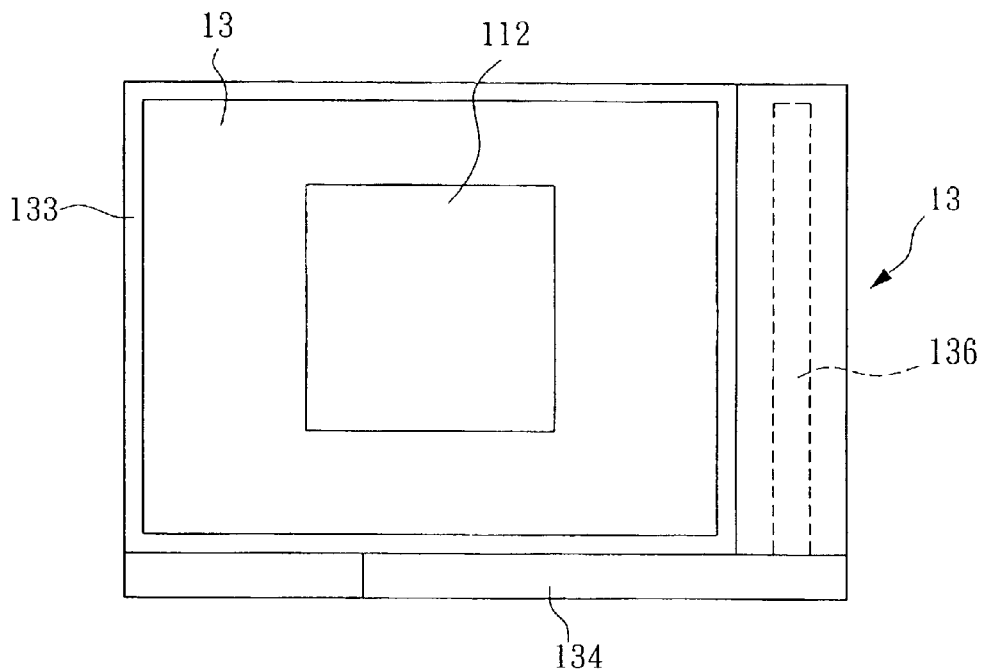
FIG. 2 is a top view for illustrating the socket according to the prior arts shown in FIG. 1.

Since the match-up and the application of the elastic conductor 5 according to the invention only consume small occupying area of circuit board 2 relatively, and a positional electric connection may just be made directly during operation, so it can reduce the limitation and the space occupied by a pulling long rod of the socket in the prior arts. Therefore, for the socket with a pulling long rod according to the prior arts as shown in FIG. 1 and FIG. 2, the invention really has an apparent progress on the area and space saving and using. Furthermore, the plurality of elastic conductors 5 are all arranged with uniform distribution manner, so the shortcoming of the prior arts—since the pulling long rod of the prior arts is arranged on one side of a traditional socket, which is further extended out the space arranging the part of its rod axis, so the gravity center of the socket, a electric-contact structure for an IC package, of the prior arts will be mostly biased from the geometric center to the direction of the arrangement of the pulling long rod and be scarcely biased to the direction of the extensive arrangement of the rod axis part, such that the damage of the electric-contact structure of the prior arts is easily caused because of its serious gravity center bias—is overcome. Applying a plurality of elastic conductors, the flexible electric-contact structure for an IC package of the invention indeed proceed a stable electric connection and proceed a positioning fixation for both the chip substrate and the circuit board through a positioning fastener, such that the shortcoming of the prior arts—the metal pin is easy to damage the circuit board—is overcome, so the invention has the functions of convenient operation, position, and connection, etc., and the shortcomings of the prior arts are thereby improved to fulfill the requirement of industry and further promote its competition ability.

In sum, being compared with the prior arts, the flexible electric-contact structure for an IC package according to the present invention has at least following advantages:

(1) The occupying area of the circuit board and the operation space are relatively smaller, since the invention replaces the socket having a pulling long rod with elastic conductors that have elasticity and the function of electric conduction so, not only the occupying area is reduced, but also the limitation on space is reduced during operation.

(2) The cost is lowered relatively, and the damage rate of connection is lowered as well. Being compared with the gliding seat, the frame, and the actuating mechanism of the socket of the prior arts, the structure of the elastic conductor elements of the invention is further simpler, so the production cost is relatively low, and the bias of the gravity center is less, and the damage is further reduced, so the requirement of the industry is fulfilled, such that its competition ability is enhanced.

However, above preferable embodiments are just applied to describe the invention in detail and are not to set a limitation to the range of the invention. Those who are familiar with such kind of arts should understand that appropriate and slight variation and adjustment still possess the merits of the invention and are also within the spirit and the range of the invention. For example, although the circuit board of the invention is described in patterns of single layer (having a single circuit layout) or double layers, the invention may also be applied to a circuit board with more layers of circuit layout. Summarizing above description, the executable solidification of the invention has already fulfilled the merits of a new-typed pattern regulated in the patent law so, please your esteemed members of reviewing committee review the present application in favorable way, and grant it as a new patent as soon as possible.

What is claimed is:

1. A flexible electric-contact structure providing electric connection between an IC package and a circuit board, wherein the IC package has a chip substrate and at least one chip electrically connecting to the chip substrate, the flexible electric-contact structure comprising:

a plurality of connection pads on the circuit board;

a plurality of soldering pads on the chip substrate and corresponding respectively to the connection pads;

a plurality of elastic conductors between the IC package and the circuit board each elastic conductor having a first end being permanently secured to either one of the soldering pads or the connection pads respectively and a second end removably secured to one of the soldering pads or the connection pads respectively;

at least one positioning fastener physically connecting the IC package and the circuit board firmly; and wherein the elastic conductor is pressed to provide an appropriate displacement for electric conduction between the IC package and the circuit board.

2. The flexible electric-contact structure according to claim 1, wherein at least one placing-and-fixing hole is arranged on the circuit board for fixing the positioning fastener.

3. The flexible electric-contact structure according to claim 1, wherein the material of the elastic conductor is an elastic metal composition.

4. The flexible electric-contact structure according to claim 1, wherein the material of the elastic conductor includes metal fibers.

5. The flexible electric-contact structure according to claim 1, wherein the elastic conductor is a hollow structure and made of a metal composition.

6. The flexible electric-contact structure according to claim 1, wherein the elastic conductor is an elastic element with an outside surface coated with a metal composition.

7. The flexible electric-contact structure according to claim 1, the material of the elastic conductor is a conducting and elastic rubber composition.

8. The flexible electric-contact structure according to claim 1, the material of the elastic conductor is a conducting polymer composition.

9. A flexible electric-contact structure providing electric connection between an IC package and a circuit board, wherein the IC package has a chip substrate and at least one chip electrically connecting to the chip substrate, the flexible electric-contact structure comprising:

a plurality of connection pads on the circuit board;

a plurality of soldering pads on the chip substrate and corresponding respectively to the connection pads;

a plurality of elastic conductors between the IC package and the circuit board, each elastic conductor having a first end being permanently secured to one of the soldering pads and a second end removably secured to one of the connection pads respectively;

at least one positioning fastener physically connecting the IC package and the circuit board firmly; and wherein the elastic conductor is pressed to provide an appropriate displacement for electric conduction between the IC package and the circuit board.

10. A flexible electric-contact structure providing electric connection between an IC package and a circuit board, wherein the IC package has a chip substrate and at least one chip electrically connecting to the chip substrate, the flexible electric-contact structure comprising:

a plurality of connection pads on the circuit board;

a plurality of soldering pads on the chip substrate and corresponding respectively to the connection pads;

a plurality of elastic conductors between the IC package and the circuit board, with at least one of the plurality of elastic conductors having an arm, a first end plane that is permanently secured to either one of the connection pads or one of the soldering pads, and a second end plane that is removably coupled to either one of the soldering pads or one of the connection pads; and at least one positioning fastener physically connecting the IC package and the circuit board firmly.

* * * * *